(12) United States Patent
Chiu et al.

(10) Patent No.: US 6,972,241 B2
(45) Date of Patent: Dec. 6, 2005

(54) METHOD OF FORMING AN STI FEATURE TO AVOID ELECTRICAL CHARGE LEAKAGE

(75) Inventors: Yih Song Chiu, Hsin Chu (TW); Jao Sheng Huang, Hsin-Chu (TW); Wen Ting Tsai, Hsin-Chu (TW); Chen Hsiang Leu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 114 days.

(21) Appl. No.: 10/761,656

(22) Filed: Jan. 20, 2004

(65) Prior Publication Data

US 2005/0158964 A1    Jul. 21, 2005

(51) Int. Cl.[7] .............................................. H01L 21/76
(52) U.S. Cl. ...................................... 438/424; 438/700
(58) Field of Search ................................ 438/424, 700

(56) References Cited

U.S. PATENT DOCUMENTS

| | | | | |
|---|---|---|---|---|
| 5,801,083 A | * | 9/1998 | Yu et al. | 438/424 |
| 5,843,846 A | * | 12/1998 | Nguyen et al. | 438/713 |
| 5,891,787 A | * | 4/1999 | Gardner et al. | 438/424 |
| 6,180,466 B1 | * | 1/2001 | Ibok | 438/296 |
| 6,261,921 B1 | * | 7/2001 | Yen et al. | 438/424 |

* cited by examiner

Primary Examiner—David S. Blum
(74) Attorney, Agent, or Firm—Tung & Associates

(57) ABSTRACT le;.5qA method for forming shallow trench isolation (STI) structure including providing a substrate comprising an overlying hardmask layer; patterning the hardmask layer to form a hardmask layer opening for etching a trench through a substrate thickness portion; etching a trench according to the patterned overlying hardmask layer; carrying out a wet chemical oxidizing process to form an oxidized surface portion on the hardmask layer; carrying out a wet chemical etching process to remove at least a portion of the oxidized surface portion to form the hardmask opening having an enlarged width and the trench opening comprising rounded upper corners; and, forming a completed planarized STI structure filled with oxide.

22 Claims, 2 Drawing Sheets

METHOD OF FORMING AN STI FEATURE TO AVOID ELECTRICAL CHARGE LEAKAGE

FIELD OF THE INVENTION

This invention generally relates to semiconductor processing methods and more particularly to a method for forming shallow trench isolation (STI) structures including top rounded corners to avoid electrical charge leakage.

BACKGROUND OF THE INVENTION

In the integrated circuit industry today, thousands of semiconductor devices, for example including CMOS transistors are formed on a single die. Generally, every device must be electrically isolated from other devices to ensure that it operates without electrical interference for other devices. The art of isolating semiconductor devices has become an important aspect in forming CMOS, DRAM, and SRAM devices derived from as MOSFETS to ensure proper operation. With the high integration of the semiconductor devices, improper electrical isolation among devices will cause current (electric charge) leakage, consuming a significant amount of power as well as compromising device functionality. Among some examples of reduced functionality include latch-up, which can damage the circuit temporarily, or permanently, noise margin degradation, voltage shift and cross-talk.

Shallow trench isolation (STI), is a preferred electrical isolation technique especially for ultra-large scale integration (ULSI) devices. STI structures allow devices to be placed closer together to achieve a higher level of circuit integration. The STI process generally involves forming trenches in the semiconductor substrate, backfilling with silicon oxide, and planarizing the excess oxide in addition to removing hardmask layers overlying the semiconductor substrate.

In the STI formation techniques of the prior art, the hardmask layer is either fully or partially removed in particular stages of the STI formation process using hot $H_3PO_4$ wet etching. One problem with hot $H_3PO_4$ wet etching to partially remove the hardmask layer is that the STI trench sidewalls are frequently damaged leading to degraded electrical isolation properties including current leakage. The trench corners and trench sidewalls are particularly susceptible to damage by preferential etching, e.g., causing roughening of the trench sidewalls. Such unintentional etching of the trench sidewall affects the electrical integrity of semiconductor devices in a number of ways such as, for example, altering the threshold voltage of MOSFET device, altering the device off-state current, and making the device susceptible to reverse short channel effects.

There is therefore a continuing need in the semiconductor processing art to develop improved methods of forming shallow trench isolation structures that will avoid the problem of undesirable etching damage as well as reduce current leakage at the STI trench corner portions.

It is therefore among the objects of the present invention to provide an improved method of forming shallow trench isolation structures that will avoid the problem of undesirable etching damage as well as reduce current leakage at the STI trench corner portions, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming shallow trench isolation (STI) structure having rounded upper trench corner portions.

In a first embodiment, the method includes providing a substrate comprising an overlying hardmask layer; patterning the hardmask layer to form a hardmask layer opening for etching a trench through a substrate thickness portion; etching a trench according to the patterned overlying hardmask layer; carrying out a wet chemical oxidizing process to form an oxidized surface portion on the hardmask layer; carrying out a wet chemical etching process to remove at least a portion of the oxidized surface portion to form the hardmask opening having an enlarged width and the trench opening comprising rounded upper corners; and, forming a completed planarized STI structure filled with oxide.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps included in forming shallow trench isolation (STI) structures. It will be appreciated that although direct benefits will be realized according to the method of the present invention by avoiding undesirable etching of material layers underlying a hardmask in an STI formation process as well as forming rounded top trench corner portions to avoid electrical current (charge) leakage, that other indirect benefits will additionally be realized including the improved electrical performance reliability of a subsequently formed semiconductor device. The term 'active areas' as used herein refers to areas of the semiconductor substrate surface where electrically active semiconductor devices are formed.

Figure 1A:
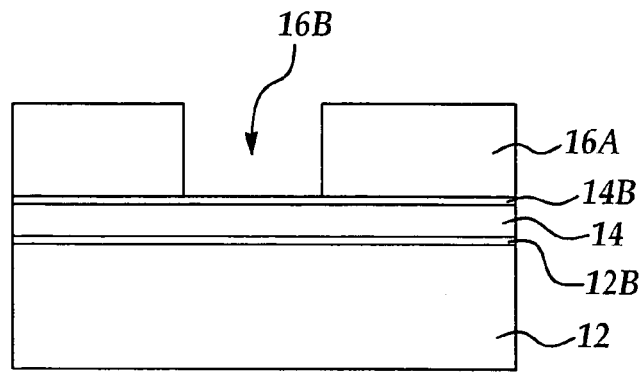
FIGS. 1A–1F are cross sectional side views of a portion of a shallow trench isolation region showing stages of manufacture of a shallow trench isolation structure according to an embodiment of the present invention.

In one exemplary implementation of the present invention, referring to FIG. 1A is shown a semiconductor substrate 12, for example silicon. It will be appreciated that the substrate may include epitaxial silicon layers, buried layers, silicon on insulator (SOI), SiGe, and GaAs. A pad oxide layer 12B of $SiO_2$ about 50 Angstroms to about 150 Angstroms is first thermally grown by conventional processes or formed by LPCVD TEOS over the silicon substrate 12 to aid in reducing surface stresses induced in subsequent processing steps. One or more hardmask layers e.g., silicon nitride (e.g., $Si_3N_4$) layer 14 is then deposited by a CVD method, for example LPCVD to a thickness of about 500 Angstroms to about 3000 Angstroms. The hard mask layer, for example may include an uppermost layer to improve critical dimension control during a subsequent dry etching process, for example formed of PECVD SiON, or LPCVD $SiO_2$.

In addition, an organic or inorganic e.g., SiON anti-reflective coating (ARC) e.g., 14B is preferably formed over the uppermost hardmask layer, e.g., SiN hardmask layer 14 to a thickness of about 200 Angstroms to about 1000 Angstroms, to reduce light reflections in a subsequent photolithographic process.

Still referring to FIG. 1A, a photoresist layer 16A, e.g., 1000 to 6000 Angstroms thick is then deposited over the ARC layer 14B and photolithographically patterned to form an opening e.g., 16B exposing a portion of the ARC layer 14B for dry etching through a thickness portion of the hardmask layer, e.g. 14 to form a dry etching hardmask for etching an STI trench.

Figure 1B:
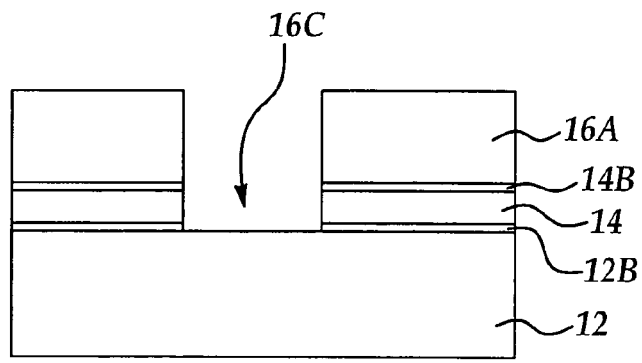

Referring to FIG. 1B, the ARC layer 14B and SiN hardmask layer 14 are then etched according to the patterned photoresist layer opening 16B to expose a portion of the substrate 12 to form hardmask opening 16C according to a conventional reactive ion etch (RIE) process, for example including a fluorocarbon etching chemistry, for example, $CF_4$. For example, the silicon nitride hardmask layer 14 is anisotropically dry etched through a thickness to include the pad oxide layer 12B to expose a surface portion of the substrate 12 according to endpoint detection.

Figure 1C:
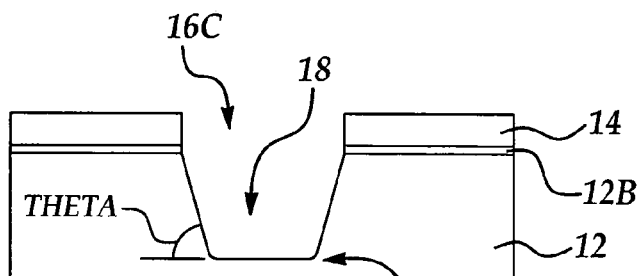

Referring to FIG. 1C, in one aspect of the method of the present invention, preferably following removal of the photoresist layer 16A, for example by a wet stripping or dry ashing process, an STI trench feature 18 is then dry etched into the silicon substrate to a depth between about 60 Angstroms and about 5000 Angstroms, preferably forming sloped sidewall portions, e.g., 18A having an angle, theta, with respect to the plane of the major surface (process surface) of the substrate preferably between about 85 and 89 degrees, the uppermost portion of the trench being wider than the bottom portion. A conventional etching chemistry, including for example, $Cl_2$, HBR, and $O_2$ is used to dry etch the trench 18 unto the substrate 12 to from a shallow trench isolation (STI) opening (trench opening) 18. Preferably, during the trench etching process, trench bottom portion corners e.g., 18B are formed having rounded corners e.g., having a radius of curvature. The ARC layer 14B is removed in the dry etching process or previous wet or dry resist stripping process.

For example, several STI trenches e.g., 18 are etched simultaneously into a semiconductor substrate, being spaced between about 0.06 microns and about 0.30 microns, each STI trench and having an upper portion wider than a lower portion, the upper portion width between about 0.03 microns and about 0.20 microns.

Figure 1D:
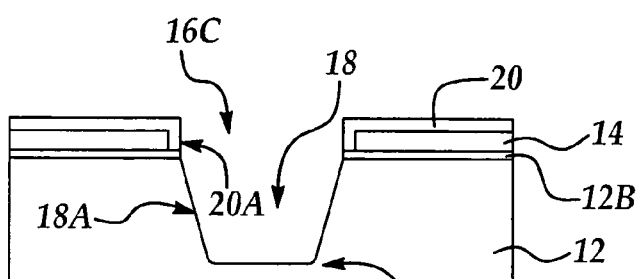

Referring to FIG. 1D, in an important aspect of the invention, the substrate including the STI trench and hardmask layer 14 is subjected to a wet oxidation process, preferably a dipping process to preferentially oxidize a surface portion e.g., 20 of the hardmask layer e.g., silicon nitride layer 14 including sidewall portions adjacent hardmask opening 16C. Preferably, the wet oxidizing solution includes a liquid phase oxidizer such as hydrogen peroxide ($H_2O_2$). More preferably, the wet oxidizing solution includes semiconductor grade hydrogen peroxide ($H_2O_2$) and semiconductor grade sulfuric acid ($H_2SO_4$) Most preferably, the wet oxidizing solution is formed of $H_2SO_4$ and $H_2O_2$ present at a volumetric ratio of $H_2SO_4$ to $H_2O_2$ from about 2 to 1 to about 10 to 1, more preferably from about 4 to 1 to about 8 to 1 with respect to a wet oxidizing solution volume.

Preferably, the substrate including the STI trench and hardmask layer 14, are dipped into a solution, optionally with a source of solution agitation such as ultrasound, bubbling, and or/stirring to improve mass transfer, for a period of about 45 minutes to about 90 minutes to oxidize a portion e.g., 20 of the hardmask layer (silicon nitride layer) 14, e.g., forming $SiON_y$ in a portion of the silicon nitride layer extending a depth of about 50 Angstroms to about 300 Angstroms into the hardmask layer 14 as measured from an exposed surface portion of the silicon nitride including into hardmask opening 16C sidewall portions, e.g., 20A. Preferably the temperature of the wet oxidizing solution is maintained at about 100° C. to about 150° C. to improve an oxidation rate. Following the wet oxidation process, the substrate is rinsed in deionized water.

Figure 1E:
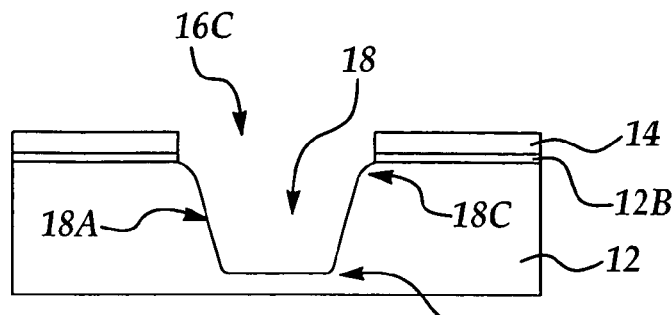

Referring to FIG. 1E, following oxidation of the hardmask layer 14, according to another aspect of the invention, an oxide wet etching step is then carried out to remove the oxidized portions of the silicon nitride layer 14 as well as underlying portions of the pad oxide layer 12B adjacent hardmask opening 16C to produce rounded top corner portions, e.g., 18C of trench 18. The oxide wet etching step is preferably a dipping process, optionally including a source of solution agitation such as ultrasound, bubbling, and or/stirring to improve mass transfer. The oxide wet etching solution preferably includes HF, preferably dilute HF, for example semiconductor grade HF starting a volumetric concentration of about 48% diluted with water, is further diluted with deionized water to form a volumetric ratio of $H_2O$ to HF (48%) of about 50 to 1 to about 100 to 1. Preferably, the oxide wet etching solution is formed to have a relatively slow etch rate of about 1 Angstroms to about 10 Angstroms/min, to avoid etching of the sidewalls of the trench opening 18. Alternatively a vapor of diluted HF may be used in the wet oxide etching process to contact the oxidized hardmask portions. The wet oxide etching process is carried out to remove the oxidized portions e.g., 20 of the hardmask layer 14 including sidewall portions 20A and underlying pad oxide 12B portions to form an enlarged width of hardmask opening 16C and rounded top corner portions, e.g., 18C of the STI trench 18. For example, the oxidized portions, e.g., 20 of the silicon nitride layer 14 are removed to enlarge the hardmask opening 16C width by about 50 Angstroms to about 300 Angstroms on a side e.g., corresponding to the depth of the oxidized portions, the hardmask opening 16C formed having a total enlarged width of about 100 Angstroms to about 600 Angstroms.

Advantageously, during the oxide wet etching process, rounded top corner portions, e.g., 18C, are formed having a positive radius of curvature with respect to the substrate surface thereby reducing current (charge) leakage around the corner edges of a completed device, e.g., a MOSFET device formed in active areas adjacent STI structures. For example, rounded corners advantageously reduce electric field strengths thereby reducing current (charge) leakage and device degradation. For example, by forming top rounded corners on STI structures, electrical properties of a completed MOSFET device are improved including threshold voltage stability, off-state current stability, and reducing reverse short channel effects.

Figure 1F:
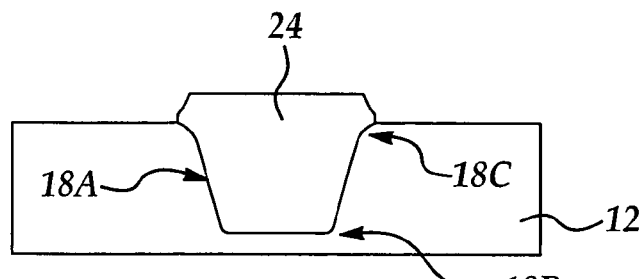

Referring to FIG. 1F, following the nitride hardmask wet oxidation and wet oxide etching pullback processes, conventional processes are then carried out to complete the formation of the STI structure. For example, one or more liner layers (not shown) of oxide/and or nitride (e.g., silicon nitride or silicon oxynitride) are formed to line the STI trench opening followed by backfilling the trench with one or more layers, e.g., 24 of STI oxide (silicon oxide), e.g., undoped silicate glass (USG) formed by HDP-CVD, spin-on process, or CVD. A planarization process is then performed to remove excess STI oxide above the hardmask layer level 14. The hardmask layer, e.g., silicon nitride, is then typically removed by a conventional wet etching process, for example using hot $H_3PO_4$, and an optional HF wet etch to at least partially remove the pad oxide layer 12B, preferably leaving a portion of the STI oxide 24 filling trench 18 protruding above the substrate 12 surface, for example having an upper protruding portion narrower in width than a lower protruding portion.

Among the advantages of the present invention are that relatively common and inexpensive chemicals e.g., sulfuric acid and hydrogen peroxide may be used in an embodiment of the present invention, thereby avoiding costly chemicals and associated handling processes. Most importantly, etching and roughening of the STI trench opening sidewalls is avoided, in contrast to prior art processes using $H_3PO_4$, thereby avoiding degradation of electrical isolation performance of the STI structure. Moreover, additional ultra-clean cleaning steps associated with prior art processes are not required following the processes outlined for embodiments of the present invention, thereby minimizing processing times while avoiding trace chemical contamination of the STI trench.

Figure 2:
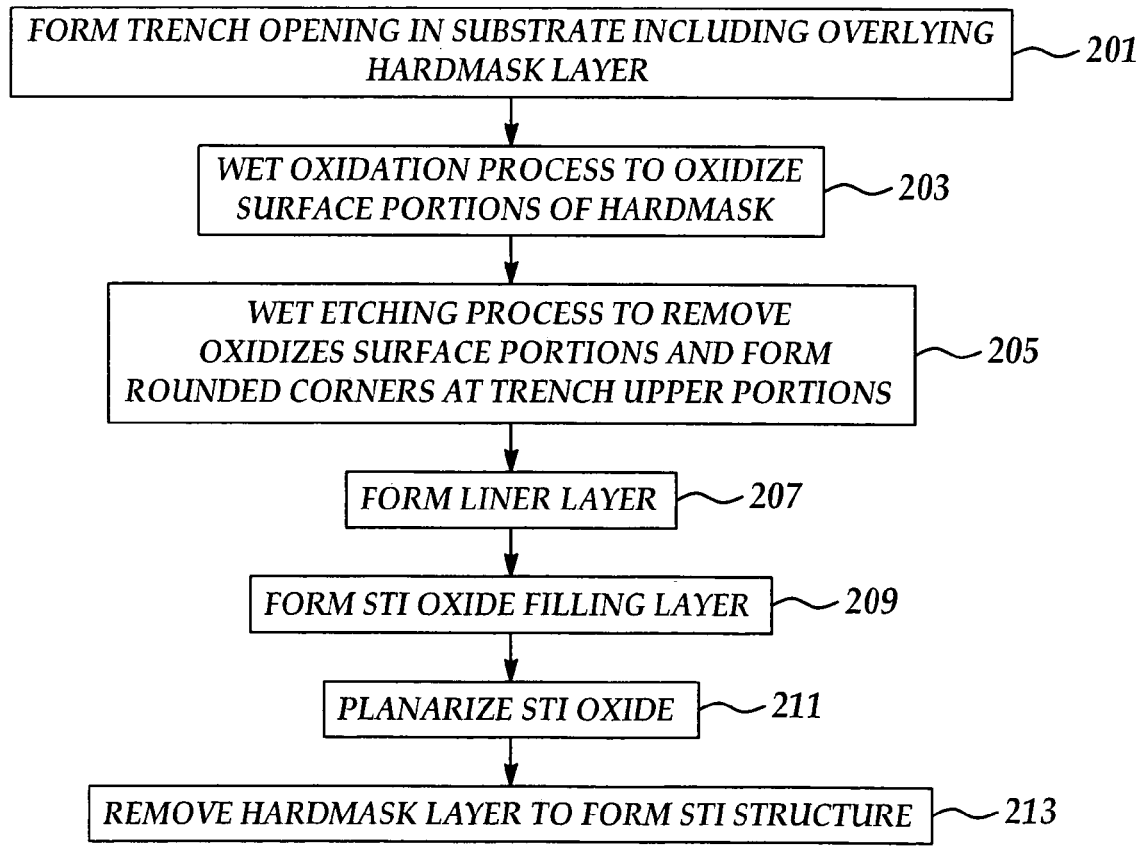
FIG. 2 is a process flow diagram including several embodiments of the present invention.

Referring to FIG. 2 is a process flow diagram including several embodiments of the present invention for forming a shallow trench isolation (STI) structure. In process 201 a shallow trench isolation (STI) trench is formed in a substrate including an overlying silicon nitride hardmask layer. In process 203, a wet oxidation process is carried out using a wet oxidizing solution according to preferred embodiments to form an oxidized surface portion of the hardmask layer. In process 205, a wet etching process is carried out to remove the oxidized surface portions according to preferred embodiments to form an enlarged width hardmask opening including rounded upper corner portions of the STI trench opening. In process 207, oxide and/or nitride liners are formed to line the trench. In process 209, the STI trench is backfilled with one or more STI oxide filling layers. In process 211, a planarization process is carried out to remove excess STI oxide above the hardmask layer. In process 213, a wet etching process is carried out to remove the hardmask layer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming shallow trench isolation (STI) structure comprising the steps of:
   providing a substrate comprising an overlying hardmask layer;
   patterning the hardmask layer to form a hardmask layer opening for etching a trench through a substrate thickness portion;
   etching a trench according to the patterned overlying hardmask layer;
   carrying out a wet chemical oxidizing process to form an oxidized surface portion on the hardmask layer;
   carrying out a wet chemical etching process to remove at least a portion of the oxidized surface portion to form the hardmask opening having an enlarged width and the trench opening comprising rounded upper corners; and,
   forming a completed planarized STI structure filled with oxide.

2. The method of claim 1, where in the substrate is selected from the group consisting of silicon, silicon germanium, and gallium arsenide.

3. The method of claim 1, wherein the hardmask layer comprises silicon nitride.

4. The method of claim 1, wherein the step of carrying out a wet chemical oxidizing process comprises contacting the hardmask layer with an oxidizing solution.

5. The method of claim 4, wherein the oxidizing solution comprises hydrogen peroxide ($H_2O_2$) and sulfuric acid ($H_2SO_4$).

6. The method of claim 5 wherein the oxidizing solution comprises a volumetric ratio of hydrogen peroxide ($H_2O_2$) to sulfuric acid ($H_2SO_4$) of about 2 to 1 to about 10 to 1.

7. The method of claim 1, wherein the temperature of the oxidizing solution is from about 100° C. to about 150° C.

8. The method of claim 1, wherein the oxidized surface portion comprises a thickness of about 50 Angstroms to about 300 Angstroms.

9. The method of claim 1, wherein the step of carrying out a wet chemical etching process comprises contacting the oxidized surface portion with HF.

10. The method of claim 9, wherein the HF comprises an HF containing solution.

11. The method of claim 10, wherein the HF containing solution comprises HF diluted with deionized water.

12. The method of claim 1, wherein the at least a portion of the oxidized surface portion has a thickness of from about 50 Angstroms to about 300 Angstroms.

13. The method of claim 1, wherein the step of forming a completed planarized STI structure comprises the steps of:
   forming a liner comprising at least one layer selected from the group consisting of silicon oxide, silicon nitride, and silicon oxynitride;
   backfilling the trench with at least one layer of STI oxide selected from the group consisting of HDP-CVD silicon oxide, CVD silicon oxide, and SOG silicon oxide;
   removing the excess STI oxide above the hardmask layer according to a planarization process; and,
   removing the hardmask layer according to a wet chemical etching process.

14. A method for forming shallow trench isolation (STI) structure to form rounded trench upper corners comprising the steps of:
   providing a substrate comprising an overlying silicon nitride hardmask layer;
   patterning the hardmask layer to form a hardmask layer opening for etching a trench through a substrate thickness portion;
   etching a trench through a substrate thickness portion according to the patterned overlying hardmask layer;
   carrying out a wet chemical oxidizing process comprising sulfuric acid and $H_2O_2$ to form an oxidized surface portion on the hardmask layer;
   carrying out a wet chemical etching process comprising HF to remove at least a portion of the oxidized surface portion to form the hardmask opening having an enlarged width and the trench opening comprising rounded upper corner portions; and,
   forming a completed planarized STI structure filled with oxide.

15. The method of claim 14, where in the substrate is selected from the group consisting of silicon, silicon germanium, and gallium arsenide.

16. The method of claim 14, wherein the hardmask layer further comprises an uppermost layer of silicon oxynitride.

17. The method of claim 14 wherein the oxidizing solution comprises a volumetric ratio of hydrogen peroxide ($H_2O_2$) to sulfuric acid ($H_2SO_4$) of about 2 to 1 to about 10 to 1.

18. The method of claim 14, wherein the temperature of the oxidizing solution is from about 100° C. to about 150° C.

19. The method of claim 14, wherein the oxidized surface portion comprises a thickness of about 50 Angstroms to about 300 Angstroms.

20. The method of claim 14, wherein the HF containing solution comprises HF diluted with deionized water.

21. The method of claim 14, wherein the at least a portion of the oxidized surface portion has a thickness of from about 50 Angstroms to about 300 Angstroms.

22. The method of claim 14, wherein the step of forming a completed planarized STI structure comprises the steps of:
  forming a liner comprising at least one layer selected from the group consisting of silicon oxide, silicon nitride, and silicon oxynitride;
  backfilling the trench with at least one layer of STI oxide selected from the group consisting of HDP-CVD silicon oxide, CVD silicon oxide, and SOG silicon oxide;
  removing the excess STI oxide above the hardmask layer according to a planarization process; and,
  removing the hardmask layer according to a wet chemical etching process.

* * * * *